United States Patent
Zheng

(10) Patent No.: US 12,550,555 B2
(45) Date of Patent: Feb. 10, 2026

(54) DISPLAY PANEL AND DISPLAY TERMINAL WITH SIGNAL WIRINGS IN DIFFERENT LAYERS OF FAN-OUT REGION

(71) Applicant: WUHAN CHINA STAR OPTOELECTRONICS SEMICONDUCTOR DISPLAY TECHNOLOGY CO., LTD., Hubei (CN)

(72) Inventor: Ying Zheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 576 days.

(21) Appl. No.: 18/002,694

(22) PCT Filed: Aug. 31, 2022

(86) PCT No.: PCT/CN2022/116194
§ 371 (c)(1),
(2) Date: Dec. 21, 2022

(87) PCT Pub. No.: WO2024/000794
PCT Pub. Date: Jan. 4, 2024

(65) Prior Publication Data
US 2024/0244899 A1    Jul. 18, 2024

(30) Foreign Application Priority Data
Jun. 30, 2022   (CN) .......................... 202210778454.6

(51) Int. Cl.
*H10K 59/131*   (2023.01)

(52) U.S. Cl.
CPC .................................. *H10K 59/131* (2023.02)

(58) Field of Classification Search
CPC ..................................................... H10K 59/131
See application file for complete search history.

(56) References Cited

U.S. PATENT DOCUMENTS

| 2014/0117320 A1* | 5/2014 | Jung ..................... H10K 59/131 |
| | | 257/40 |
| 2017/0288008 A1* | 10/2017 | Kim ................... H10K 59/1315 |

(Continued)

FOREIGN PATENT DOCUMENTS

| CN | 107037646 | 8/2017 |
| CN | 107065336 A | 8/2017 |

(Continued)

OTHER PUBLICATIONS

International Search Report in International application No. PCT/CN2022/116194, mailed on Dec. 29, 2022.

(Continued)

*Primary Examiner* — Lex H Malsawma

(57) ABSTRACT

The present application provides a display panel and a display terminal. The display panel includes a display region, a fan-out region, and a bending region. The display panel includes a plurality of data lines in a display region a plurality of first signal wirings, a plurality of second signal wirings, a plurality of third signal wirings, and a plurality of fourth signal wirings in a fan-out region. The first signal wirings, second signal wirings, third signal wirings, and fourth signal wirings are disposed in different layers.

17 Claims, 4 Drawing Sheets

(56) References Cited

U.S. PATENT DOCUMENTS

| | | | |
|---|---|---|---|
| 2018/0130856 A1* | 5/2018 | Kim | H10K 59/353 |
| 2018/0177050 A1 | 6/2018 | Li et al. | |
| 2018/0197484 A1* | 7/2018 | Moon | G09G 3/035 |
| 2020/0058725 A1* | 2/2020 | Ka | H10K 59/131 |
| 2020/0176540 A1* | 6/2020 | Park | H10D 86/60 |
| 2021/0257438 A1* | 8/2021 | Cho | H10K 59/88 |

FOREIGN PATENT DOCUMENTS

| | | | |
|---|---|---|---|
| CN | 107123634 A | 9/2017 | |
| CN | 108878484 A | 11/2018 | |
| CN | 109147574 A | 1/2019 | |
| CN | 113410277 A | 9/2021 | |
| CN | 113629039 A | 11/2021 | |
| CN | 113964142 A | 1/2022 | |
| CN | 114003143 A | 2/2022 | |
| KR | 20200023569 A | 3/2020 | |

OTHER PUBLICATIONS

Written Opinion of the International Search Authority in International application No. PCT/CN2022/116194, mailed on Dec. 29, 2022.

Chinese Office Action issued in corresponding Chinese Patent Application No. 202210778454.6 dated Jun. 20, 2025, pp. 1-6.

* cited by examiner

DISPLAY PANEL AND DISPLAY TERMINAL WITH SIGNAL WIRINGS IN DIFFERENT LAYERS OF FAN-OUT REGION

FIELD OF INVENTION

The present application relates to a field of display technologies, especially to a display panel and a display terminal.

BACKGROUND OF INVENTION

With a development trend of extreme full screens, a frame of a display panel becomes more and more narrow, and a screen ratio thereof also becomes more and more higher to bring more ultimate experiences to consumers.

However, with increase of a resolution of the screen, a number of data lines included by a display panel increases drastically, a space of a lower frame of the display panel saved for the wirings increases to reduce an active area (AA) of the display region.

SUMMARY OF INVENTION

Technical Issue

An embodiment of the present application provides a display panel and a display terminal for reducing a lower frame of a display panel to improve a screen ratio.

Technical Solution

The embodiment of the present application provides a display panel and a display terminal for reducing a lower frame of the display panel and improving a screen ratio of the display region.

The embodiment of the present application discloses a display panel, the display panel includes a display region, a fan-out region, and a bending region, the fan-out region is located between the display region and the bending region, and the display panel includes:
  a substrate;
  a plurality of data lines disposed on the substrate, wherein the data lines are located in the display region;
  a plurality of first signal wirings located in the fan-out region, wherein one of the first signal wirings is connected to one of the data lines;
  a plurality of second signal wirings located in the fan-out region, wherein one of the second signal wirings is connected to one of the data lines;
  a plurality of third signal wirings located in the fan-out region, wherein one of the third signal wirings is connected to one of the data lines; and
  a plurality of fourth signal wirings located in the fan-out region, wherein one of the fourth signal wirings is connected to one of the data lines;
  wherein the first signal wirings, the second signal wirings, the third signal wirings, and the fourth signal wirings are disposed in different layers.

Optionally, in some embodiments provided by the present application, the fan-out region includes a first fan-out region and a second fan-out region, and the first fan-out region is located on two sides of the second fan-out region;
  the first signal wirings and the second signal wirings extend from the first fan-out region to the second fan-out region; and the third signal wirings and the fourth signal wirings are located in the second fan-out region and are arranged along a first direction.

Optionally, in some embodiments provided by the present application, one of the first signal wirings includes a first wiring section and a second wiring section, the first wiring section is partially located in the first fan-out region, the second wiring section is located in the second fan-out region, and the second wiring section extends along the first direction.

Optionally, in some embodiments provided by the present application, one of the second signal wirings includes a third wiring section and a fourth wiring section, the third wiring section is partially located in the first fan-out region, the fourth wiring section is located in the second fan-out region, and the fourth wiring section extends along the first direction.

Optionally, in some embodiments provided by the present application, along a direction of the second fan-out region pointing to the first fan-out region, the second wiring section and the fourth wiring section are sequentially arranged among the third signal wirings and the fourth signal wirings, and one of the second wiring section and the fourth wiring section is disposed between one of the third signal wirings and one of the fourth signal wirings that are adjacent to each other.

Optionally, in some embodiments provided by the present application, the display region includes a first side edge, a second side edge, and a third side edge, the first side edge and the second side edge are connected through the third side edge, the third side edge is curved, and the data lines of the display region corresponding to the third side edge are connected to the first signal wirings and second signal wirings; and
  an extension direction of the first wiring section and the third wiring section is the same as an extension direction of the third side edge.

Optionally, in some embodiments provided by the present application, the data lines include a plurality of first data lines and a plurality of second data lines, the first data lines are located on two sides of the second data lines, the first data lines correspond to the third side edge, some of the first data lines are connected to the first signal wirings, and another some of the first data lines are connected to the second signal wirings.

Optionally, in some embodiments provided by the present application, the first signal wirings and the second signal wirings are alternately connected to the first data lines.

Optionally, in some embodiments provided by the present application, the third signal wirings and the fourth signal wirings are alternately connected to the second data lines.

Optionally, in some embodiments provided by the present application, the display panel further includes:
  a shielding metal layer disposed on the substrate, wherein the first signal wirings are located on the shielding metal layer;
  a first metal layer disposed on a side of the shielding metal layer away from the substrate and disposed insulatively from the shielding metal layer, wherein the third signal wirings are located on the first metal layer;
  a second metal layer disposed on a side of the first metal layer away from the substrate and disposed insulatively from the first metal layer, wherein the fourth signal wirings are located on the second metal layer; and
  a third metal layer disposed on a side of the second metal layer away from the first metal layer and disposed insulatively from the second metal layer, wherein the second signal wirings are located on the third metal layer.

Optionally, in some embodiments provided by the present application, the fan-out region includes a first fan-out region and a second fan-out region, and the first fan-out region is located on two sides of the second fan-out region;

the first signal wirings, the second signal wirings, and the third signal wirings extend from the first fan-out region to the second fan-out region; and the fourth signal wirings are located in the second fan-out region and are arranged along a first direction.

Optionally, in some embodiments provided by the present application, one of the first signal wirings, one of the second signal wirings, and one of the third signal wirings are disposed alternately.

Optionally, in some embodiments provided by the present application, one of the first signal wirings includes a first wiring section and a second wiring section connected to each other, one of the second signal wirings includes a third wiring section and a fourth wiring section connected to each other, one of the third signal wirings includes a fifth wiring section and a sixth wiring section connected to each other; and the first wiring section, the third wiring section, and the fifth wiring section extend from the first fan-out region to the second fan-out region, the second wiring section, the fourth wiring section, and the sixth wiring section are located in the second fan-out region, and the second wiring section, and the fourth wiring section, and the sixth wiring section extend along the first direction.

Optionally, in some embodiments provided by the present application, along a direction of the second fan-out region pointing to the first fan-out region, the second wiring section, the fourth wiring section, and the sixth wiring section are sequentially arranged among the fourth signal wirings, and one of the second wiring section, the fourth wiring section, and the sixth wiring section is disposed between adjacent two of the fourth signal wirings.

Optionally, in some embodiments provided by the present application, the display panel further includes:

a shielding metal layer disposed on the substrate, wherein the fourth signal wirings are located on the shielding metal layer;

a first metal layer disposed on a side of the shielding metal layer away from the substrate and disposed insulatively from the shielding metal layer, wherein the second signal wirings are located on the first metal layer;

a second metal layer disposed on a side of the first metal layer away from the substrate and disposed insulatively from the first metal layer, wherein the third signal wirings are located on the second metal layer; and a third metal layer disposed on a side of the second metal layer away from the first metal layer and disposed insulatively from the second metal layer, wherein the first signal wirings are located on the third metal layer.

Optionally, in some embodiments provided by the present application, the display panel further includes a first active layer and a second active layer, the first active layer is disposed on a side of the shielding metal layer away from the substrate and is disposed insulatively from the shielding metal layer, and the second active layer is disposed on a side of the second metal layer away from the first metal layer and is disposed insulatively from the second metal layer; and the first active layer is a low-temperature polycrystalline silicon active layer, and the second active layer is a metal oxide active layer.

Optionally, in some embodiments provided by the present application, the shielding metal layer further includes a shielding metal wiring, and the shielding metal wiring is located in the display region.

Optionally, in some embodiments provided by the present application, the display panel further includes a fourth metal layer disposed on a side of the third metal layer away from the second metal layer, and the data lines are located on the fourth metal layer.

Optionally, in some embodiments provided by the present application, a height of the second fan-out region along the first direction is less than or equal to 600 microns.

Accordingly, the embodiment of the present application also provides a display terminal, the display terminal includes the above display panel and a casing, and the display panel is disposed in the casing.

Advantages

The embodiment of the present application provides a display panel and a display terminal. The display panel includes a display region, a fan-out region, and a bending region. The fan-out region is located between the display region and the bending region. The display panel includes a substrate, a plurality of data lines, and a plurality of first signal wirings, a plurality of second signal wirings, a plurality of third signal wirings, and a plurality of fourth signal wirings located in the fan-out region. The data lines are disposed on the substrate, and data lines are located in the display region. One of the first signal wirings is connected to one of the data lines. One of the second signal wirings is connected to one of the data lines. One of the third signal wirings is connected to one of the data lines. One of the fourth signal wirings is connected to one of the data lines. The first signal wirings, the second signal wirings, the third signal wirings, and the fourth signal wirings are disposed in different layers. In the embodiment of the present application, because the first signal wirings, the second signal wirings, the third signal wirings, and the fourth signal wirings are disposed in different layers, a number of the signal wirings disposed in the same film layer can be reduced. Under a condition of a distance between the adjacent first signal wiring and second signal wiring and a distance between the adjacent third signal wiring and fourth signal wiring kept constant, the display panel of the present embodiment can reduce an area occupied by the fan-out region to reduce a lower frame of the display panel and improve a screen ratio of the display region.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
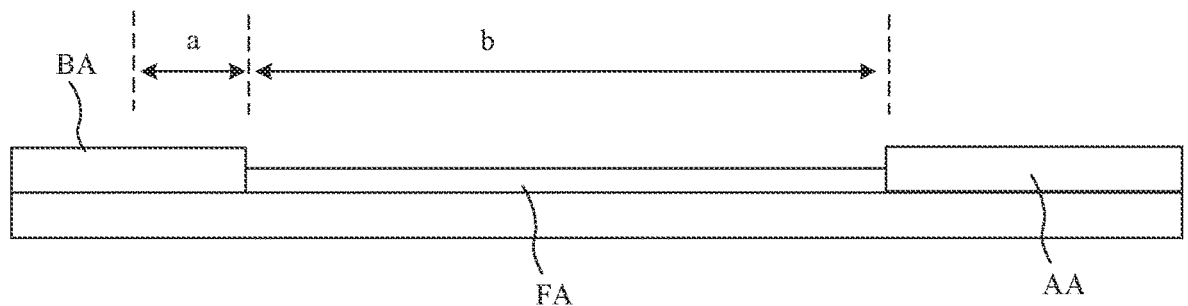
FIG. 1 is a schematic view of a display panel provided by an embodiment of the present application.

To make the purpose, technical solutions and advantages of the present invention clearer, the present invention will be further described in detail below in conjunction with the accompanying drawings. Please refer to the drawings in the accompanying drawings, where the same reference characters represent the same elements. The following description is based on the specific embodiments shown in the present invention, which should not be regarded as limitations to other specific embodiment of the present invention not described in detail. The word "embodiment" used in this specification means an example, exemplary instance or illustration.

In the description of the present application, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present application and simplifying the description instead of indicating or implying that the referred device or element must have a specific orientation or position, must to be structured and operated with the specific orientation or position. Therefore, they should not be understood as limitations to the present application. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present application, a meaning of "a plurality of" is two or more, unless there is a clear and specific limitation otherwise.

The embodiment of the present application provides a display panel described in detail as follows. It should be explained that a sequence of description of the following embodiments is not limit to a preference sequence of the embodiments.

With reference to FIG. 1, FIG. 1 is a schematic view of a display panel provided by an embodiment of the present application. Left and right frames and upper frame of a conventional display panel can be made very narrow (for example, a width less than 1 mm), and of a bending region BA of the lower frame of the display panel has a bending radius a. When the bending region bends, a bonding precision of a backplate and a layout of wirings of a fan-out region would cause a over-wide lower frame, which disadvantages development of a lower narrow frame. After the inventor's research, the above issue results from that the lower frame of the display panel is usually designed to have more dense wirings such that a structure of the lower frame is more complicated when compared to other frames. An oblique layout manner is usually chosen for conventional wirings to wire connection lines out from the bending region BA in the fan-out region FA obliquely for connection with data lines in the display region AA. In the display region AA, a number of the data lines is great. With increase of a resolution, the number of the data lines drastically increases. For example, under a resolution of 1080*2340, data lines are 2160. According to the conventional oblique layout, to prevent shorting among connection lines, a width of a lower frame needs to increase, namely, a b value would be very large (greater than 1 mm), which disadvantages achievement of a lower narrow frame.

The embodiment of the present application provides a display panel. The display panel includes a display region, a fan-out region, and a bending region. The fan-out region is located between the display region and the bending region. The display panel includes a substrate, a plurality of data lines, and a plurality of first signal wirings, a plurality of second signal wirings, a plurality of third signal wirings, and a plurality of fourth signal wirings located in the fan-out region. The data lines are disposed on the substrate, and data lines are located in the display region. One of the first signal wirings is connected to one of the data lines. One of the second signal wirings is connected to one of the data lines. One of the third signal wirings is connected to one of the data lines. One of the fourth signal wirings is connected to one of the data lines. The first signal wirings, the second signal wirings, the third signal wirings, and the fourth signal wirings are disposed in different layers. In the embodiment of the present application, because the first signal wirings, the second signal wirings, the third signal wirings, and the fourth signal wirings are disposed in different layers, a number of the signal wirings disposed in the same film layer can be reduced. Under a condition of a distance between the adjacent first signal wiring and second signal wiring and a distance between the adjacent third signal wiring and fourth signal wiring kept constant, the display panel of the present embodiment can reduce an area occupied by the fan-out region to reduce a lower frame of the display panel and improve a screen ratio of the display region.

The display panel provided by the present application is described in detail by specific embodiments as follows.

Figure 2:
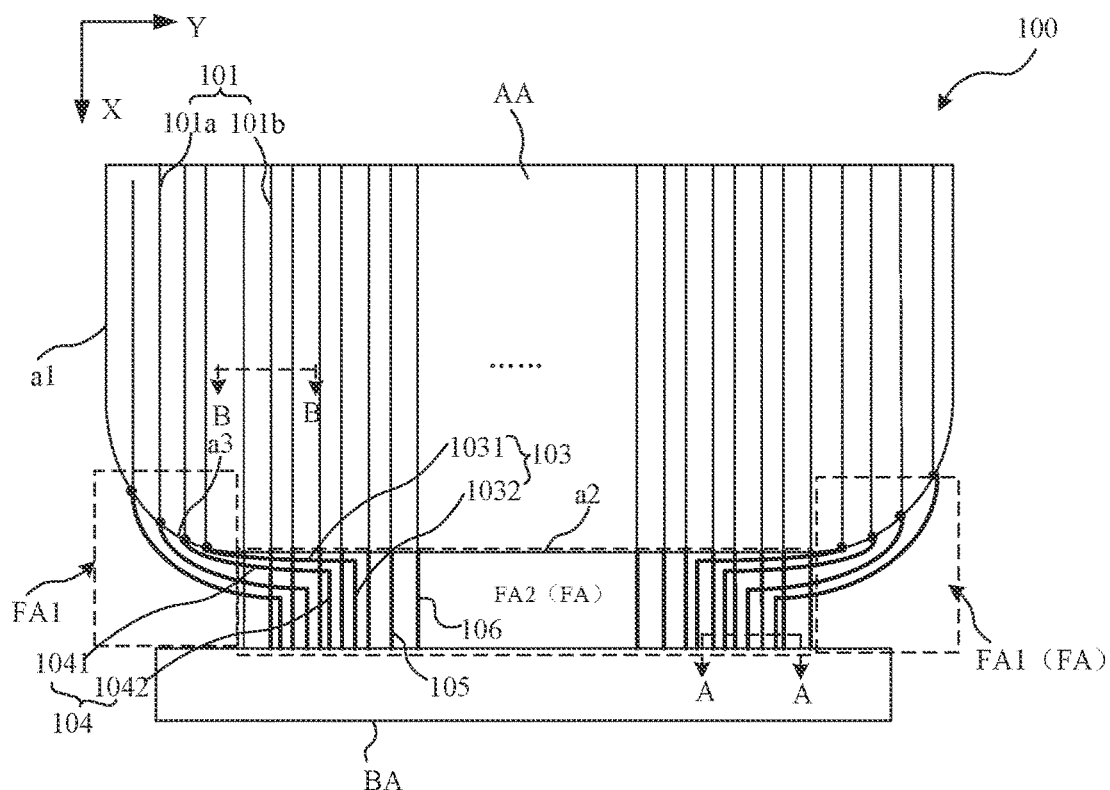
FIG. 2 is a first plane schematic view of the display panel provided by the embodiment of the present application.
Figure 3:
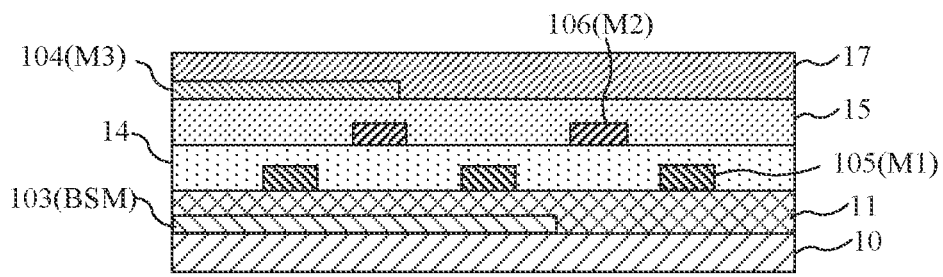
FIG. 3 is a schematic cross-sectional structural view of a fan-out region cut along a A-A direction of FIG. 2.
Figure 4:
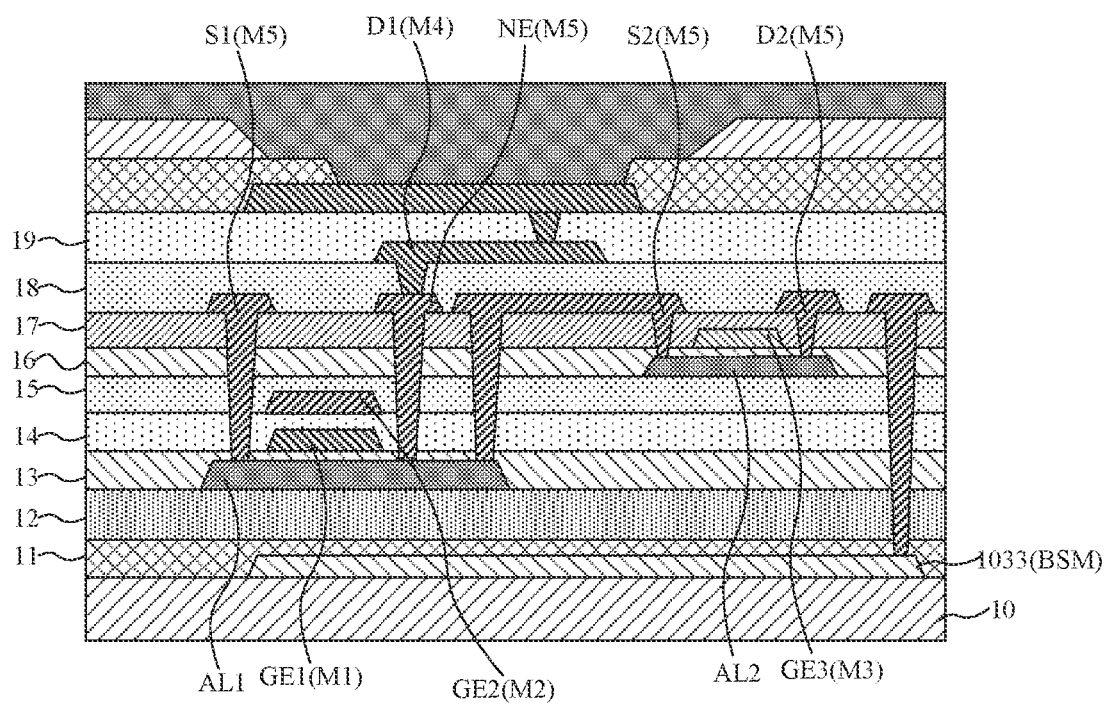
FIG. 4 is a schematic cross-sectional structural view of a display region cut along a B-B direction of FIG. 2.

With reference to FIGS. 2, 3, and 4, FIG. 2 is a first plane schematic view of the display panel provided by the embodiment of the present application. FIG. 3 is a schematic cross-sectional structural view of a fan-out region cut along a A-A direction of FIG. 2. FIG. 4 is a schematic cross-sectional structural view of a display region cut along a B-B direction of FIG. 2. An embodiment of the present application provides a display panel. The display panel 100 includes a display region AA, a fan-out region FATA the bending region BA, the fan-out region FA is located between the display region AA, and a bending region BA. The fan-out region FA includes a first fan-out region FA1 and a the second fan-out region FA2. The first fan-out region FA1 is located on two sides of the second fan-out region FA2. The second fan-out region FA2 is a rectangular region. An edge of the rectangular region is a lower frame of the display panel 100. The first fan-out region FA1 is a region of the fan-out region FA except for the second fan-out region FA2. The display panel 100 includes a substrate 10, a plurality of data lines 101, a plurality of first signal wirings 103, a plurality of second signal wirings 104, a plurality of third signal wirings 105, and a plurality of fourth signal wirings 106. The data lines 101 is disposed on the substrate 10, and the data lines 101 is located in the display region AA. The data lines 101 extend along a first direction X and are arranged along a second direction Y. One of the first signal wirings 103 is connected to one of the data lines 101, and the first signal wirings 103 extend from the first fan-out region FA1 to the second fan-out region FA2. One of the second signal wirings 104 is connected to one of the data lines 101. The second signal wirings 104 extend from the first fan-out region FA1 to the second fan-out region FA1. One of the third signal wirings 105 is connected to one of the data lines 101. The third signal wirings 105 is located in the second fan-out region FA2, and the third signal wirings 105 extend along the first direction X. One of the fourth signal wirings 106 is connected to one of the data lines. The fourth signal wirings 106 is located in the second fan-out region FA2, and the fourth signal wirings 106 extend along the first direction X. The first signal wirings 103, the second signal wirings 104, the third signal wirings 105, and the fourth signal wirings 106 are disposed in different layers.

In the present application, because the first signal wirings 103, the second signal wirings 104, the third signal wirings 105, and the fourth signal wirings 106 are disposed in different layers. Namely, the first signal wirings 103 and the second signal wirings 104 located in the first fan-out region FA1 are disposed in different film layers, and the third signal wirings 105 and the fourth signal wirings 106 located in the second fan-out region FA2 are disposed in different film layers, which can reduce a number of the signal wirings disposed in the same film layer. Therefore, compared to a conventional technology disposing the first signal wirings 103 and the second signal wirings 104 in the same film layer and disposing the third signal wirings 105 and the fourth signal wirings 106 in the same layer, the present embodiment disposes the first signal wirings 103, the second signal wirings 104, the third signal wirings 105, and the fourth signal wirings 106 in different layers. Under a condition of a distance between the adjacent first signal wiring 103 and second signal wiring 104 unchanged, the display panel 100 of the present embodiment can reduce an area occupied by the first fan-out region FA1. In particular, a distance of the above first fan-out region FA1 along the first direction X can decrease, namely, a distance of the lower frame in the first fan-out region FA1 along the first direction X can decrease such that the display panel 100 can achieve a design of a narrow frame.

In particular, the display region AA is configured to achieve a display function of the display panel 100. A pixel circuit composed of thin film transistors is disposed in the display region AA and is configured to drive light emitting elements on the substrate 10 to emit light. The data lines 101 extending along the first direction X in the display region AA are configured to transmit data voltages to the pixel circuit.

The data lines 101 includes first data lines 101a and second data lines 101b. The first data lines 101a are located on two sides of the second data lines 101b. The first data lines 101a extend along the first direction X to a corner frame between side edges of the display panel 100, and the second data lines 101b extend along the first direction X to a lower frame of the display panel 100. Some of the first data lines 101a are connected to the first signal wirings 103, and another some of the first data lines 101a are connected to the second signal wirings 104. Some of the second data lines 101b are connected to the third signal wirings 105, and another some of the second data lines 101b are connected to the fourth signal wirings 106.

The first signal wirings 103 and the second signal wirings 104 are connected to the first data lines 101a alternately. The third signal wirings 105 and the fourth signal wirings 106 are connected to the second data lines 101b alternately.

The first signal wirings 103 and the second signal wirings 104 are partially disposed between the third signal wirings 105 and the fourth signal wirings 106.

The first signal wirings 103 and the second signal wirings 104 are disposed alternately. The third signal wirings 105 and the fourth signal wirings 106 are disposed alternately. A layout space of signal wirings of the fan-out region FA along a vertical direction is reduced.

In particular, one of the first signal wirings 103 includes a first wiring section 1031 and a second wiring section 1032 that are connected to each other. The first wiring section 1031 is partially located in the first fan-out region FA1. The second wiring section 1032 is located in the second fan-out region FA2, and the second wiring section 1032 extends along the first direction X. One of the second signal wirings 104 includes a third wiring section 1041 and a fourth wiring section 1042. The third wiring section 1041 is partially located in the first fan-out region FA1. The fourth wiring section 1042 is located in the second fan-out region FA2, and the fourth wiring section 1042 extends along the first direction X.

It should be explained that in the embodiment of the present application, the second wiring section 1032 and the fourth wiring section 1042 are wirings parallel to the third signal wirings 105 and the fourth signal wirings 106. The first wiring section 1031 is a line segment of the first signal wiring 103 except for the second wiring section 1032. The third wiring section 1041 is a line segment of the second signal wiring 104 except for the fourth wiring section 1042.

Along a direction of the second fan-out region FA2 pointing to the first fan-out region FA1, the second wiring section 1032, fourth wiring 1042 are sequentially arranged among the third signal wirings 105 and the fourth signal wirings 106, and one of a second wiring section 1032 and a fourth wiring section 1042 is disposed between the third signal wiring 105 and the fourth signal wirings 106 adjacent to each other. Namely, in the embodiment of the present application, only one wiring section is disposed between the third signal wirings 105 and the fourth signal wirings 106 adjacent to each other, and the second wiring section 1032 and the fourth wiring section 1042 are arranged sequentially to prevent shorting due to an over-short distance between the adjacent second wiring section 1032 and fourth wiring section 1042 along the second direction Y, which improves stability of the display panel 100.

In some embodiments, the display region AA includes a first side edge a1, a second side edge a2, and a third side edge a3. The first side edge a1 is connected to the second side edge a2 through the third side edge a3. The third side edge a3 is curved. The data lines 101 in the display region AA corresponding to the third side edge a3 is connected to the first signal wirings 103 and the second signal wirings 104. The first data lines 101a correspond to the third side edge a3. An extension direction of the first wiring section 1031 of the third wiring section 1041 is the same as an extension direction of the third side edge a3. Furthermore, the second wiring sections 1032 and the fourth wiring sections 1042 are disposed alternately among the third signal wirings 105 and the fourth signal wirings 106.

In the embodiment of the present application, the first wiring section 1031 and the third wiring section 1041 extend along the third side edge a3 into the first fan-out region FA1, and the second wiring sections 1032 and the fourth wiring sections 1042 are disposed alternately among the third signal wirings 105 and the fourth signal wirings 106. Therefore, a distance of the first fan-out region FA1 along the first direction X is further reduced. Also, the second wiring sections 1032 and the fourth wiring sections 1042 are inserted alternately among the third signal wirings 105 and the fourth signal wirings 106 to fully uses spaces among the third signal wirings 105 and the fourth signal wirings 106, which prevents accumulation of the second wiring section 1032 and the fourth wiring section 1042 in the first fan-out region FA1 to cause a risk of shorting.

In some embodiments, a height of the second fan-out region FA2 along the first direction X is less than or equal to 600 microns. For example, the height of the second fan-out region FA2 along the first direction X can be one of 600 microns, 500 microns, 400 microns, 300 microns, 200 microns, 100 microns, and 50 microns.

In the embodiment of the present application, disposing signal wirings connected to the data lines 101 on four different film layers can reduce a number of signal wirings disposed in the same film layer. Therefore, compared to a conventional technology disposing the first signal wirings 103 and the second signal wirings 104 in the same film layer and disposing the third signal wirings 105 and the fourth signal wirings 106 in the same layer, the present embodiment disposes the first signal wirings 103, the second signal wirings 104, the third signal wirings 105, and the fourth signal wirings 106 in different layers. Under a condition of a distance between the adjacent first signal wiring 103 and second signal wiring 104 kept constant, the display panel 100 of the present embodiment can reduce an area occupied by the first fan-out region FA1. In particular, the distance of the above first fan-out region FA1 along the first direction X can be reduced, namely, a distance of lower frame in the first fan-out region FA1 along the first direction X can be reduced such that the display panel 100 can achieve a design of a narrow frame.

With further reference to FIGS. 2 and 3, the display panel further includes a shielding metal layer BSM, a first metal layer M1, a second metal layer M2, a third metal layer M3, and a fourth metal layer M4. The shielding metal layer BSM is disposed on the substrate 10. The first signal wirings 103 is located on the shielding metal layer BSM. The first metal layer M1 is disposed on a surface of the shielding metal layer BSM away from the substrate 10 and is disposed insulatively from the shielding metal layer BSM. The third signal wirings 105 is located on the first metal layer M1. The second metal layer M2 is disposed on a surface of the first metal layer M1 away from the substrate 10 and is disposed insulatively from the first metal layer M1. The fourth signal wirings 106 is located on the second metal layer M2. The third metal layer M3 is disposed on a surface of the second metal layer M2 away from the first metal layer M1 and is disposed insulatively from the second metal layer M2. The second signal wirings 104 is located on the third metal layer M3.

In some embodiments, the shielding metal layer BSM further includes a shielding metal wiring 1033. The shielding metal wiring 1033 is located in the display region AA. In the embodiment of the present application, because the shielding metal layer BSM includes the first signal wirings and the shielding metal wiring 1033, namely, the shielding metal layer BSM including the first signal wirings and the shielding metal wiring 1033 can be formed by the same process. Therefore, the present application needs no additional film layer for disposing the first signal wirings and also requires no mask. Namely, original processes of the display panel are used for implementing a multi-layer signal wiring layout such that a distance of the first fan-out region FA1 along the first direction X is reduced, which reduces a distance of the lower frame along the first direction X and improves a screen ratio of the display region of the display panel.

The display panel 100 further includes a barrier layer 11, a buffer layer 12, a first active layer AL1, a first gate electrode insulation layer 13, a second gate electrode insulation layer 14, a first interlayer dielectric layer 15, a second active layer AL2, a third gate electrode insulation layer 16, a second interlayer dielectric layer 17, a first planarization layer 18, and a second planarization layer 19.

The barrier layer 11 covers the shielding metal layer BSM.

The buffer layer 12 is disposed on a surface of the barrier layer 11 away from the substrate 10. A material of the buffer layer 12 includes but is not limited to silicon-contained oxide, nitride or nitric-oxide.

The first active layer AL1 is disposed on a side of the shielding metal layer BSM away from the substrate 10 and is disposed insulatively from the shielding metal layer BSM. In particular, the first active layer AL1 is disposed on a side of the buffer layer 12 away from the substrate 10. The first active layer AL1 is a low-temperature polycrystalline silicon active layer.

The first gate electrode insulation layer 13 is disposed on a surface of the first active layer AL1 away from the substrate 10. The first metal layer M1 is disposed on a side of the first gate electrode insulation layer 13 away from the first active layer AL1. The first metal layer M1 includes a first gate electrode GE1 and the third signal wirings 105.

The second gate electrode insulation layer 14 is disposed on a surface of the first gate electrode insulation layer 13 away from the buffer layer 12. The second gate electrode insulation layer 14 covers the first metal layer M1. The second metal layer M2 is disposed on the second gate electrode insulation layer 14. The second metal layer M2 includes a second gate electrode GE2 and the fourth signal wiring 1042.

The first interlayer dielectric layer 15 is disposed on a surface of the second gate electrode insulation layer 14 away from the first gate electrode insulation layer 13 and covers the second metal layer M2.

The second active layer AL2 is disposed on a side of the second metal layer M2 away from the first metal layer M1 and is disposed insulatively from the second metal layer M2. In particular, the second active layer AL2 is disposed on a surface of the first interlayer dielectric layer 15 away from the second gate electrode insulation layer 14. the second active layer AL2 is a metal oxide active layer.

The third gate electrode insulation layer 16 is disposed on a surface of the first interlayer dielectric layer 15 away from the second gate electrode insulation layer 14. The third metal layer M3 is disposed on a surface of the third gate electrode insulation layer 16 away from the second gate electrode insulation layer 14. The third metal layer M3 includes the second signal wirings 104 and a third gate electrode GE3.

The second interlayer dielectric layer 17 is disposed on a side of the third gate electrode insulation layer 16 away from first interlayer dielectric layer. The fourth metal layer M4 is disposed on a side of the second interlayer dielectric layer 17 away from the third gate electrode insulation layer 16. The fourth metal layer M4 includes a first source electrode S1, a first drain electrode D1, a contact electrode TE, a second source electrode S2, a second drain electrode D2, and the data line 101. The first source electrode and the first drain electrode are connected to the first active layer AL1 through via holes. The second source electrode S2 and the second drain electrode D2 are connected to the second active layer AL2 through via holes. Furthermore, the first active layer AL1 is connected to the second source electrode S2 through the contact electrode TE.

In some embodiments, the display panel 100 further includes a fifth metal layer M5. The fifth metal layer M5 is disposed on a surface of the first planarization layer 18 away from the second interlayer dielectric layer 17. The data lines can also be disposed on the fifth metal layer M5. The fifth metal layer M5 further includes a connection electrode NE, and the connection electrode NE is configured to be connected to a first drain electrode D1 and a light emitting functional layer of the display panel 100 to drive the display panel to emit light.

Figure 5:
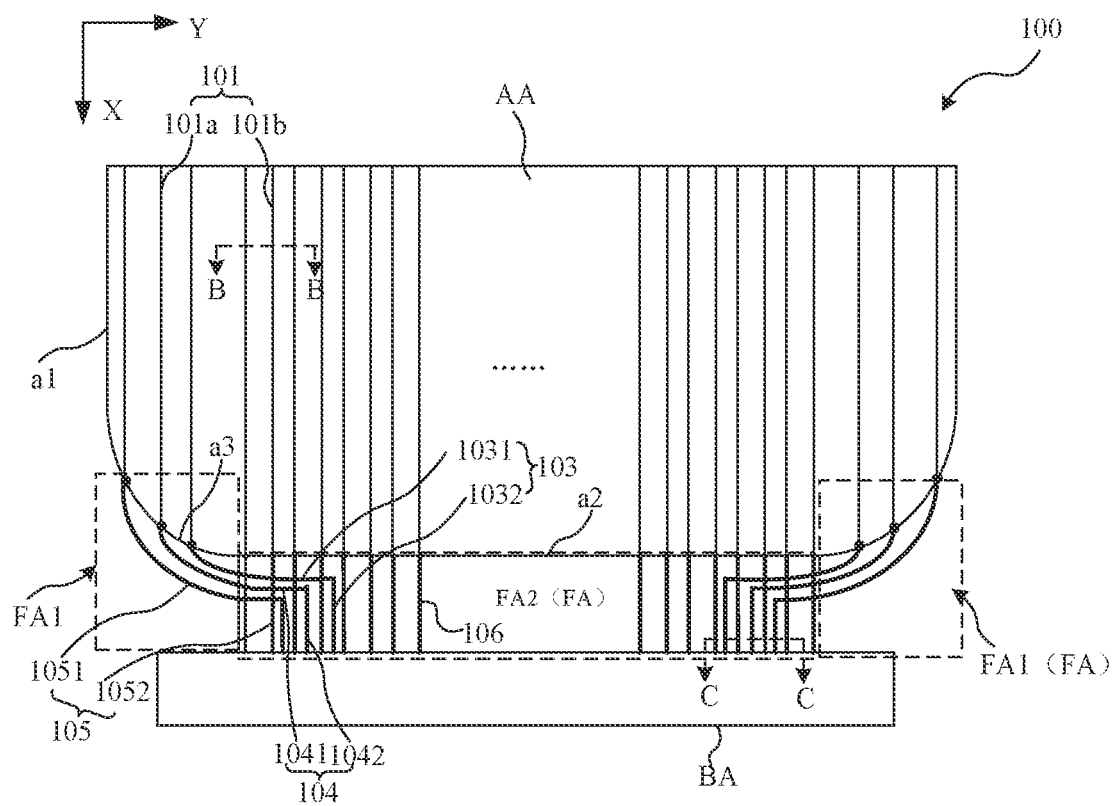
FIG. 5 is a second plane schematic view of the display panel provided by the embodiment of the present application.
Figure 6:
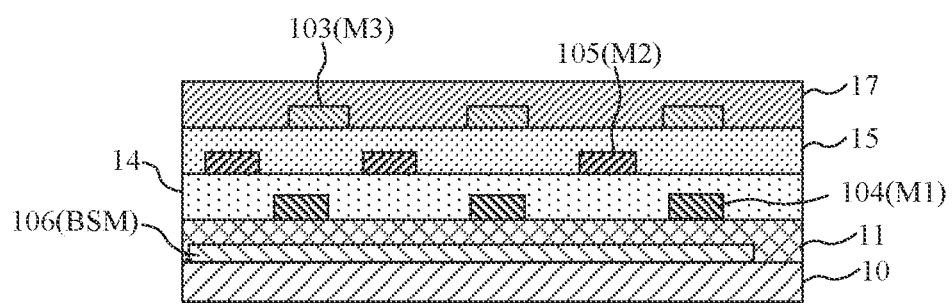
FIG. 6 is a schematic cross-sectional structural view of a fan-out region cut along a C-C direction of FIG. 5.

With reference to FIGS. 5 and 6, FIG. 5 is a second plane schematic view of the display panel provided by the embodiment of the present application. FIG. 6 is a schematic cross-sectional structural view of a fan-out region cut along a C-C direction of FIG. 5. A difference between the display panel 100 provided by the embodiment of the present application and the display panel 100 provided in FIG. 2 is that the first signal wirings 103, the second signal wirings 104, and the third signal wirings 105 extend from the first fan-out region FA1 to the second fan-out region FA2, the fourth signal wirings 106 is located in the second fan-out region FA2 and is arranged along the first direction X.

One of the first signal wirings 103, one of the second signal wirings 104, and one of the third signal wirings 105 are disposed alternately.

The first signal wiring 103 includes the first wiring section 1031 and the second wiring section 1032 connected to each other. The second signal wiring 104 includes the third wiring section 1041 and the fourth wiring section 1042 connected to each other. The third signal wiring 105 includes a fifth wiring section 1051 and a sixth wiring section 1052 connected to each other. The first wiring section 1031, the third wiring section 1041, and the fifth wiring section 1051 extend from the first fan-out region FA1 to the second fan-out region FA2. The second wiring section 1032, the fourth wiring section 1042, and the sixth wiring section 1052 are disposed alternately among the fourth signal wirings 106, and the second wiring section 1032, the fourth wiring section 1042, and the sixth wiring section 1052 extend along the first direction X.

It should be explained that in the embodiment of the present application, the second wiring section 1032, the fourth wiring section 1042, and the sixth wiring section 1052 are wirings parallel to the fourth signal wirings 106. The first wiring section 1031 is a line segment of the first signal wirings 103 except for the second wiring section 1032. The third wiring section 1041 is a line segment of the second signal wirings 104 except for the fourth wiring section 1042. The fifth wiring section 1051 is a line segment of the third signal wirings 105 except for the sixth wiring section 1052.

In some embodiments, along a direction of the second fan-out region FA2 pointing to the first fan-out region FA1, the second wiring section 1032, the fourth wiring section 1042, and the sixth wiring section 1052 are sequentially arranged among the fourth signal wirings 106, and one of the second wiring section 1032, the fourth wiring section 1042, and the sixth wiring section 1052 is disposed between adjacent two of the fourth signal wirings 106. Namely, in the embodiment of the present application, only one wiring section is disposed between adjacent two of the fourth signal wirings 106, and the second wiring section 1032, the fourth wiring section 1042, and the sixth wiring section 1052 are arranged sequentially to prevent shorting due to distances among adjacent ones of the second wiring section 1032, the fourth wiring section 1042, and the sixth wiring section 1052 along the second direction Y, which improves stability of the display panel 100.

In some embodiments, some of the first data lines 101a are connected to the first signal wirings 103, some of the first data lines 101a are connected to the second signal wirings 104, some of the first data lines 101a are connected to the third signal wirings 105. the second data lines 101b are connected to the fourth signal wirings 106.

One of the first signal wirings 103, one of the second signal wirings 104, and one of the third signal wirings 105 are connected to the first data lines 101a alternately.

In the embodiment of the present application, the first signal wirings 103 is located on the third metal layer M3. The second signal wirings 104 is located on the first metal layer M1. The third signal wirings 105 is located on the second metal layer M2. The fourth signal wirings 106 is located on the shielding metal layer BSM.

In the present application, because the first signal wirings 103, the second signal wirings 104, the third signal wirings 105, and the fourth signal wirings 106 are disposed in different layers, namely, disposing the first signal wirings 103, the second signal wirings 104, and the third signal wirings in the first fan-out region FA1 into different film layers can reduce a number of the signal wirings disposed in the same film layer. Therefore, compared to a conventional technology disposing the first signal wirings 103 and the second signal wirings 104 in the same film layer and disposing the third signal wirings 105 and the fourth signal wirings 106 in the same layer, the present embodiment disposes the first signal wirings 103, the second signal wirings 104, the third signal wirings 105, and the fourth signal wirings 106 in different layers. Under a condition of distances among the first signal wirings 103, the second signal wirings 104, and the third signal wirings 105 kept constant, the display panel 100 of the present embodiment further reduces an area occupied by the first fan-out region FA1. In particular, the distance of the above first fan-out region FA1 along the first direction X can be reduced, namely, a distance of a lower frame in the first fan-out region FA1 along the first direction X can be reduced such that the display panel 100 can achieve a design of a narrow frame.

Figure 7:
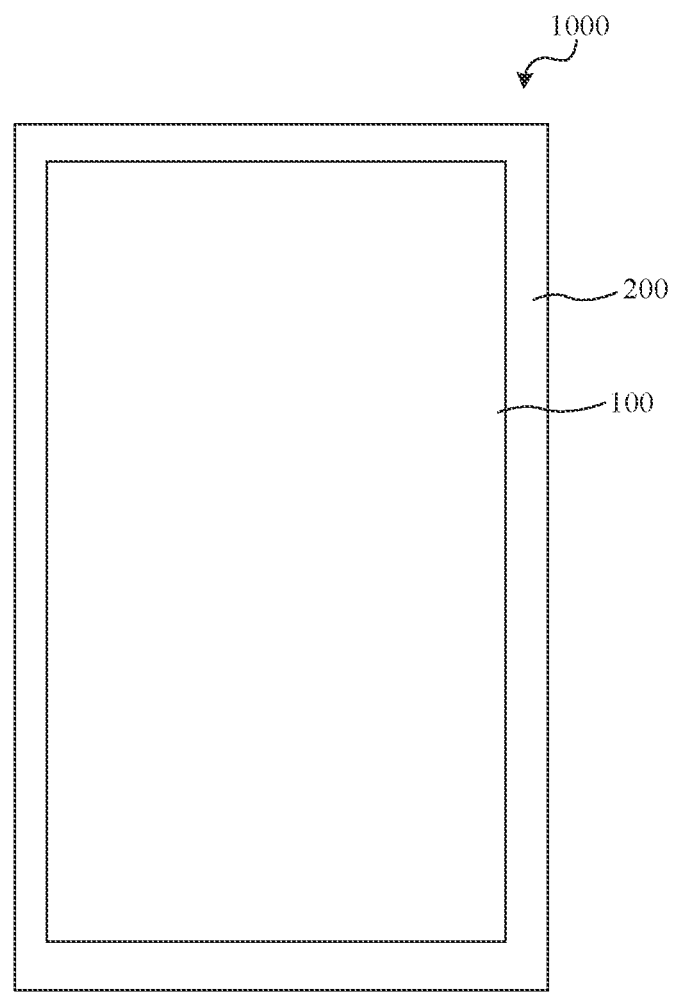
FIG. 7 is a plane schematic view of a display terminal provided by the embodiment of the present application.

Accordingly, with reference to FIG. 7, FIG. 7 is a plane schematic view of a display terminal provided by the embodiment of the present application. The embodiment of the present application also provides a display terminal 1000. The display terminal 1000 includes the display panel 100 and a casing 200. The display panel 100 is disposed in the casing 200.

The display panel 100 is the above the display panel 100.

The display terminal 1000 can be a cell phone, and can be any electron product with display functions, which includes but is not limited to: television, notebook, desktop display, tablet, digital camera, smart bracelet, smart glasses, vehicle display, medical apparatus, industrial control apparatus, interactive touch terminal, etc., and the embodiment of the present application has no specific limit thereto.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display panel, comprising a display region, a fan-out region, and a bending region, wherein the fan-out region is located between the display region and the bending region, and the display panel comprises:
- a substrate;
- a plurality of data lines disposed on the substrate, wherein the data lines are located in the display region;
- a plurality of first signal wirings located in the fan-out region, wherein one of the first signal wirings is connected to one of the data lines;
- a plurality of second signal wirings located in the fan-out region, wherein one of the second signal wirings is connected to one of the data lines;
- a plurality of third signal wirings located in the fan-out region, wherein one of the third signal wirings is connected to one of the data lines; and
- a plurality of fourth signal wirings located in the fan-out region, wherein one of the fourth signal wirings is connected to one of the data lines;
- wherein the first signal wirings, the second signal wirings, the third signal wirings, and the fourth signal wirings are disposed in different layers;
- wherein the fan-out region comprises a first fan-out region and a second fan-out region, and the first fan-out region is located on two sides of the second fan-out region;
- wherein the first signal wirings and the second signal wirings extend from the first fan-out region to the second fan-out region; and
- wherein the third signal wirings and the fourth signal wirings are located in the second fan-out region and are arranged along a first direction;
- wherein the display panel further comprises:
  - a shielding metal layer disposed on the substrate, wherein the first signal wirings are located on the shielding metal layer;
  - a first metal layer disposed on a side of the shielding metal layer away from the substrate and disposed insulatively from the shielding metal layer, wherein the third signal wirings are located on the first metal layer;
  - a second metal layer disposed on a side of the first metal layer away from the substrate and disposed insulatively from the first metal layer, wherein the fourth signal wirings are located on the second metal layer; and
  - a third metal layer disposed on a side of the second metal layer away from the first metal layer and disposed insulatively from the second metal layer, wherein the second signal wirings are located on the third metal layer.

2. The display panel according to claim 1, wherein one of the first signal wirings comprises a first wiring section and a second wiring section, the first wiring section is partially located in the first fan-out region, the second wiring section is located in the second fan-out region, and the second wiring section extends along the first direction.

3. The display panel according to claim 2, wherein one of the second signal wirings comprises a third wiring section and a fourth wiring section, the third wiring section is partially located in the first fan-out region, the fourth wiring section is located in the second fan-out region, and the fourth wiring section extends along the first direction.

4. The display panel according to claim 3, wherein along a direction of the second fan-out region pointing to the first fan-out region, the second wiring section and the fourth wiring section are sequentially arranged among the third signal wirings and the fourth signal wirings, and one of the second wiring section and the fourth wiring section is disposed between one of the third signal wirings and one of the fourth signal wirings that are adjacent to each other.

5. The display panel according to claim 3, wherein the display region comprises a first side edge, a second side edge, and a third side edge, the first side edge and the second side edge are connected through the third side edge, the third side edge is curved, and the data lines of the display region corresponding to the third side edge are connected to the first signal wirings and second signal wirings; and
- an extension direction of the first wiring section and the third wiring section is the same as an extension direction of the third side edge.

6. The display panel according to claim 5, wherein the data lines comprise a plurality of first data lines and a plurality of second data lines, the first data lines are located on two sides of the second data lines, the first data lines correspond to the third side edge, some of the first data lines are connected to the first signal wirings, and another some of the first data lines are connected to the second signal wirings.

7. The display panel according to claim 6, wherein the first signal wirings and the second signal wirings are alternately connected to the first data lines.

8. The display panel according to claim 6, wherein the third signal wirings and the fourth signal wirings are alternately connected to the second data lines.

9. The display panel according to claim 1, wherein the display panel further comprises a first active layer and a second active layer, the first active layer is disposed on a side of the shielding metal layer away from the substrate and is disposed insulatively from the shielding metal layer, and the second active layer is disposed on a side of the second metal layer away from the first metal layer and is disposed insulatively from the second metal layer; and
- the first active layer is a low-temperature polycrystalline silicon active layer, and the second active layer is a metal oxide active layer.

10. The display panel according to claim 9, wherein the shielding metal layer further comprises a shielding metal wiring, and the shielding metal wiring is located in the display region.

11. The display panel according to claim 9, wherein the display panel further comprises a fourth metal layer disposed on a side of the third metal layer away from the second metal layer, and the data lines are located on the fourth metal layer.

12. The display panel according to claim 1, wherein a height of the second fan-out region along the first direction is less than or equal to 600 microns.

13. A display terminal, wherein the display terminal comprises the display panel according to claim 1 and a casing, and the display panel is disposed in the casing.

14. A display panel, comprising a display region, a fan-out region, and a bending region, wherein the fan-out region is located between the display region and the bending region, and the display panel comprises:
- a substrate;
- a plurality of data lines disposed on the substrate, wherein the data lines are located in the display region;
- a plurality of first signal wirings located in the fan-out region, wherein one of the first signal wirings is connected to one of the data lines;
- a plurality of second signal wirings located in the fan-out region, wherein one of the second signal wirings is connected to one of the data lines;

a plurality of third signal wirings located in the fan-out region, wherein one of the third signal wirings is connected to one of the data lines; and a plurality of fourth signal wirings located in the fan-out region, wherein one of the fourth signal wirings is connected to one of the data lines;

wherein the first signal wirings, the second signal wirings, the third signal wirings, and the fourth signal wirings are disposed in different layers;

wherein the fan-out region comprises a first fan-out region and a second fan-out region, and the first fan-out region is located on two sides of the second fan-out region;

the first signal wirings, the second signal wirings, and the third signal wirings extend from the first fan-out region to the second fan-out region;

the fourth signal wirings are located in the second fan-out region and are arranged along a first direction;

wherein the display panel further comprises:
- a shielding metal layer disposed on the substrate, wherein the fourth signal wirings are located on the shielding metal layer;
- a first metal layer disposed on a side of the shielding metal layer away from the substrate and disposed insulatively from the shielding metal layer, wherein the second signal wirings are located on the first metal layer;
- a second metal layer disposed on a side of the first metal layer away from the substrate and disposed insulatively from the first metal layer, wherein the third signal wirings are located on the second metal layer; and
- a third metal layer disposed on a side of the second metal layer away from the first metal layer and disposed insulatively from the second metal layer, wherein the first signal wirings are located on the third metal layer.

15. The display panel according to claim 14, wherein one of the first signal wirings, one of the second signal wirings, and one of the third signal wirings are disposed alternately.

16. The display panel according to claim 15, wherein one of the first signal wirings comprises a first wiring section and a second wiring section connected to each other, one of the second signal wirings comprises a third wiring section and a fourth wiring section connected to each other, one of the third signal wirings comprises a fifth wiring section and a sixth wiring section connected to each other; and the first wiring section, the third wiring section, and the fifth wiring section extend from the first fan-out region to the second fan-out region, the second wiring section, the fourth wiring section, and the sixth wiring section are located in the second fan-out region, and the second wiring section, and the fourth wiring section, and the sixth wiring section extend along the first direction.

17. The display panel according to claim 16, wherein along a direction of the second fan-out region pointing to the first fan-out region, the second wiring section, the fourth wiring section, and the sixth wiring section are sequentially arranged among the fourth signal wirings, and one of the second wiring section, the fourth wiring section, and the sixth wiring section is disposed between adjacent two of the fourth signal wirings.

* * * * *